US012615966B2

(12) United States Patent
Murakami

(10) Patent No.: US 12,615,966 B2
(45) Date of Patent: Apr. 28, 2026

(54) TWO AXIS PIEZOELECTRIC ELEMENT

(71) Applicant: KYOCERA Corporation, Kyoto (JP)

(72) Inventor: Michiya Murakami, Tokyo (JP)

(73) Assignee: KYOCERA CORPORATION, Kyoto (JP)

( * ) Notice: Subject to any disclaimer, the term of this patent is extended or adjusted under 35 U.S.C. 154(b) by 940 days.

(21) Appl. No.: 17/796,923

(22) PCT Filed: Feb. 1, 2021

(86) PCT No.: PCT/JP2021/003533
§ 371 (c)(1),
(2) Date: Aug. 2, 2022

(87) PCT Pub. No.: WO2021/157522
PCT Pub. Date: Aug. 12, 2021

(65) Prior Publication Data
US 2023/0058604 A1 Feb. 23, 2023

(30) Foreign Application Priority Data
Feb. 7, 2020 (JP) ................................. 2020-019622

(51) Int. Cl.
*H10N 30/87* (2023.01)
*H10N 30/20* (2023.01)
*H10N 30/50* (2023.01)

(52) U.S. Cl.
CPC ......... *H10N 30/871* (2023.02); *H10N 30/204* (2023.02); *H10N 30/50* (2023.02)

(58) Field of Classification Search
CPC .... H10N 30/871; H10N 30/204; H10N 30/50; H10N 30/2046
See application file for complete search history.

(56) References Cited

U.S. PATENT DOCUMENTS 6,066,911 A * 5/2000 Lindemann ........ H10N 30/2023
310/366
7,042,142 B2 * 5/2006 Sasaki .................... H10N 30/50
310/365
(Continued)

FOREIGN PATENT DOCUMENTS

CN 1547779 A 11/2004
EP 4177976 A1 5/2023
JP 2004-531189 A 10/2004
(Continued)

*Primary Examiner* — Emily P Pham
(74) *Attorney, Agent, or Firm* — Volpe Koenig

(57) ABSTRACT
A piezoelectric element includes a stack including a plurality of internal electrodes and a plurality of piezoelectric layers stacked on one another, and a surface electrode located on a side surface of the stack and connected to the plurality of internal electrodes. A second electrode illustrated in FIG. 3B includes a first conductor including a strip extending in a longitudinal direction and an extension having one end continuous with the strip and another end exposed on the side surface of the stack and connected to the surface electrode. The piezoelectric element includes a second conductor located between the extension and an opposite portion of the side surface of the stack opposite to a portion of the side surface on which the other end of the extension is exposed.

5 Claims, 5 Drawing Sheets

(56) References Cited

U.S. PATENT DOCUMENTS

| | | | |
|---|---|---|---|
| 2004/0251771 | A1 | 12/2004 | Dames |
| 2016/0337760 | A1 | 11/2016 | Suenaga |

FOREIGN PATENT DOCUMENTS

| | | | |
|---|---|---|---|
| JP | 4240472 | B2 | 3/2009 |
| JP | 4249472 | B2 | 4/2009 |
| WO | 02/103816 | A2 | 12/2002 |
| WO | 2009/028348 | A1 | 3/2009 |
| WO | 2010/035437 | A1 | 4/2010 |
| WO | 2015/114849 | A1 | 8/2015 |

* cited by examiner

FIG. 2C
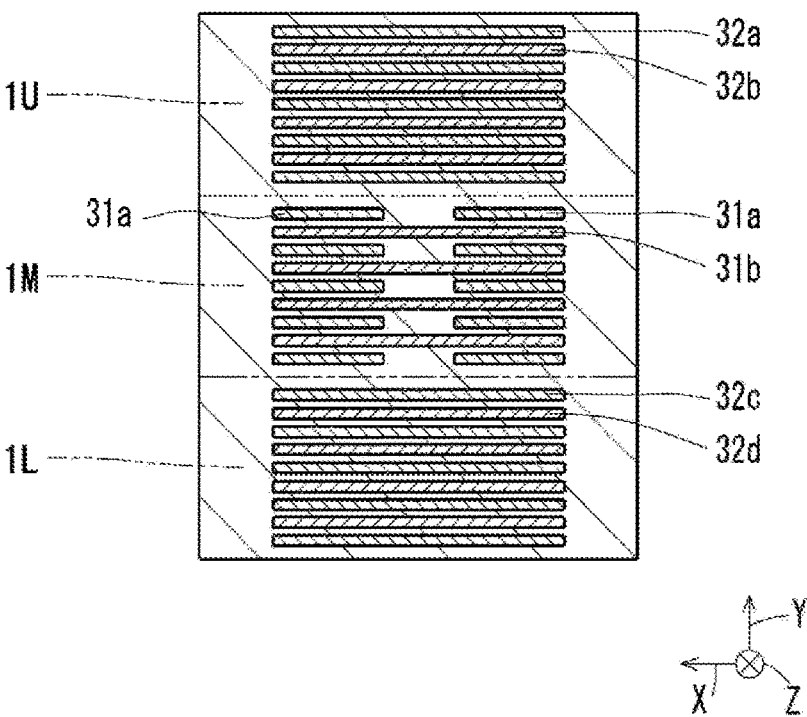
FIG. 3A
FIG. 3B
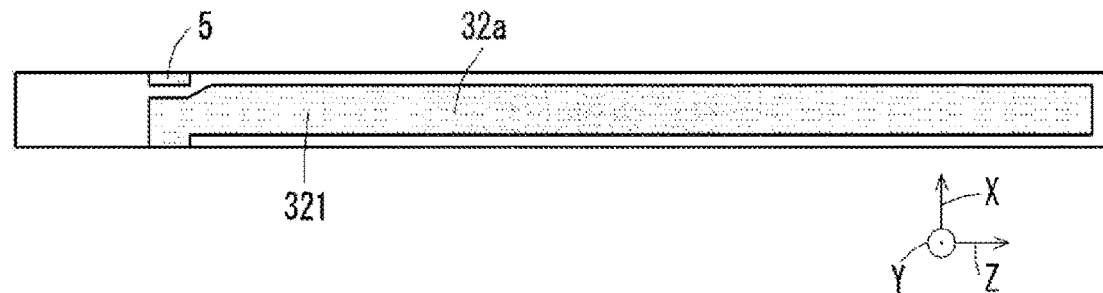

TWO AXIS PIEZOELECTRIC ELEMENT

TECHNICAL FIELD

The present disclosure relates to a piezoelectric element.

BACKGROUND OF INVENTION

A known technique is described in, for example, Patent Literature 1.

CITATION LIST

Patent Literature

Patent Literature 1: Japanese Patent No. 4240472

SUMMARY

A piezoelectric element according to one or more aspects of the present disclosure includes a stack including a plurality of internal electrodes and a plurality of piezoelectric layers stacked on one another, and a surface electrode located on a side surface of the stack and connected to the plurality of internal electrodes. The plurality of internal electrodes include a first electrode configured to apply a voltage to the plurality of piezoelectric layers to cause the stack to bend in a first direction orthogonal to a longitudinal direction of the stack, and a second electrode configured to apply a voltage to the plurality of piezoelectric layers to cause the stack to bend in a second direction orthogonal to the longitudinal direction and the first direction. At least one of the first electrode or the second electrode includes a first conductor including a strip extending in the longitudinal direction and an extension having one end continuous with the strip and another end exposed on the side surface of the stack and connected to the surface electrode. The piezoelectric element includes a second conductor located between the extension and an opposite portion of the side surface opposite to a portion of the side surface on which the other end of the extension is exposed.

BRIEF DESCRIPTION OF THE DRAWINGS

The objects, features, and advantages of the present disclosure will become more apparent from the following detailed description and the drawings.

FIG. 2C is a cross-sectional view taken along line C-C in FIG. 1A.

FIG. 3A is a diagram of an internal electrode pattern.

FIG. 3B is a diagram of an internal electrode pattern.

DESCRIPTION OF EMBODIMENTS

A piezoelectric element with the structure that forms the basis of a piezoelectric element according to one or more embodiments of the present disclosure includes piezoelectric layers and internal electrodes that are stacked on one another. The piezoelectric element is used as a piezoelectric actuator that deforms by bending with a voltage applied to the internal electrodes. Such a piezoelectric actuator can deform slightly with high precision.

A piezoelectric actuator described in Patent Literature 1 is elongated along the Z-axis and has a distal end movable in the XY plane.

To allow the distal end to move in the XY plane, the piezoelectric actuator includes internal electrodes in multiple patterns exposed on the side surfaces of the stack for connection to surface electrodes. The internal electrodes include extensions with their ends exposed at predetermined positions on the side surfaces. The internal electrodes illustrated in FIG. 16 of Patent Literature 1 have a small electrode width to prevent the piezoelectric layers from expanding or contracting due to their extensions. In this case, the stack can have non-uniform thicknesses between areas including the extensions of the internal electrodes and areas without including the extensions of the internal electrodes, thus lowering precision in deformation of the piezoelectric actuator by bending.

Figure 1A:
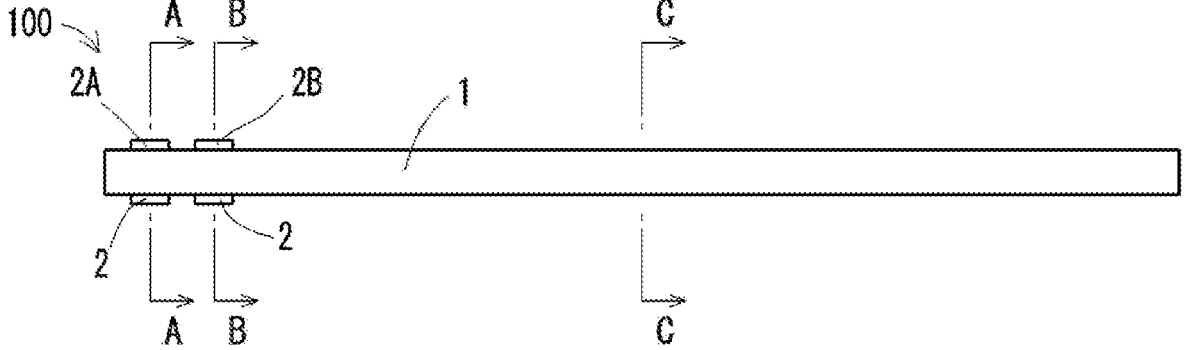
FIG. 1A is an external plan view of a piezoelectric element.
Figure 1B:
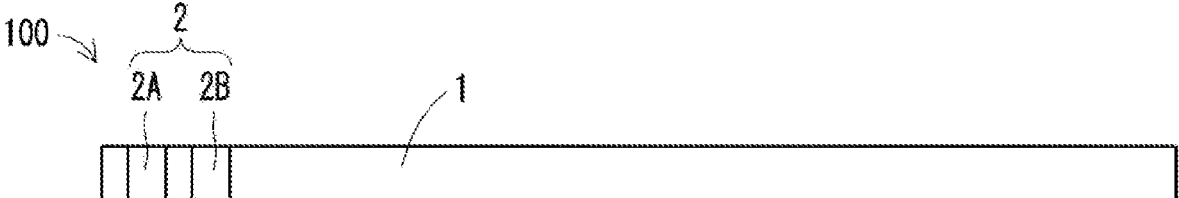
FIG. 1B is an external side view of the piezoelectric element.
Figure 2A:
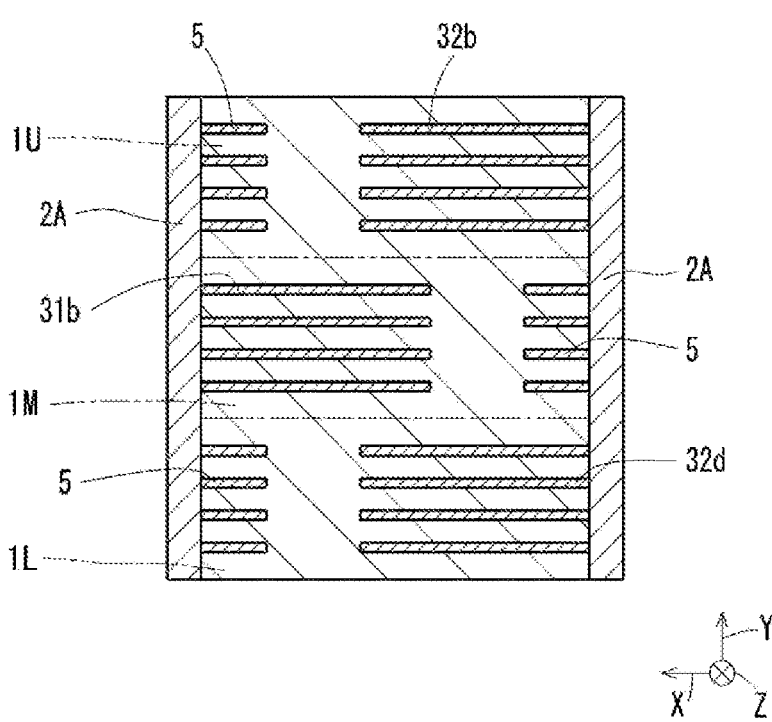
FIG. 2A is a cross-sectional view taken along line A-A in FIG. 1A.
Figure 2B:
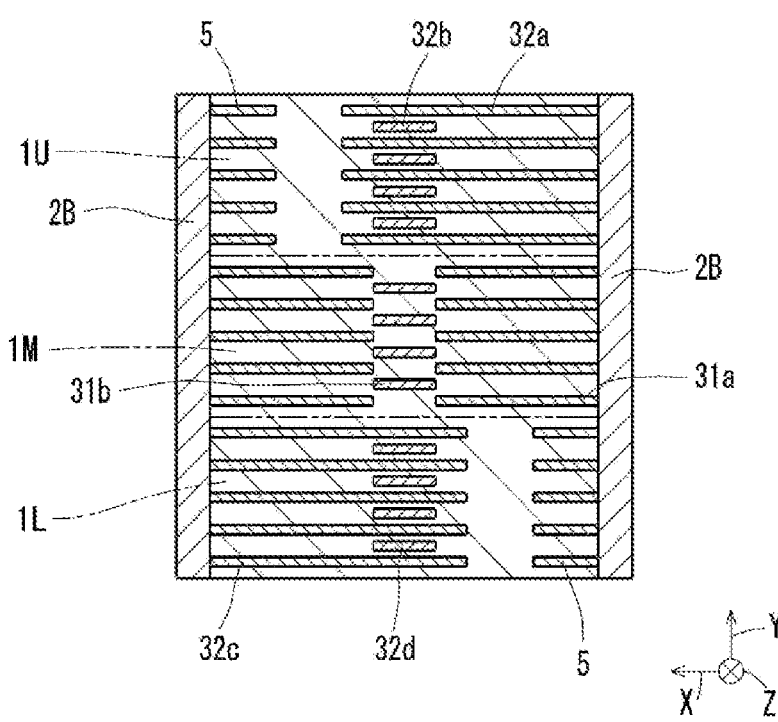
FIG. 2B is a cross-sectional view taken along line B-B in FIG. 1A.

FIG. 1A is an external plan view of a piezoelectric element, and FIG. 1B is an external side view of the piezoelectric element. FIG. 2A is a cross-sectional view taken along line A-A in FIG. 1A. FIG. 2B is a cross-sectional view taken along line B-B in FIG. 1A. FIG. 2C is a cross-sectional view taken along line C-C in FIG. 1A. A piezoelectric element 100 includes a stack 1 including internal electrodes 3 and piezoelectric layers 4 that are stacked on one another and surface electrodes 2 located on side surfaces of the stack 1 and electrically connected to the internal electrodes 3. The piezoelectric element 100 according to the present embodiment is a piezoelectric actuator that applies a voltage to the internal electrodes 3 through the surface electrodes 2 to cause the stacked piezoelectric layers 4 to deform by bending. As illustrated in FIGS. 1A and 1B, the piezoelectric element 100 according to the present embodiment is, for example, a rectangular or quadrangular prism, and has one distal end in its longitudinal or axial direction movable as the piezoelectric element 100 deforms by bending. The surface electrodes 2 are located on the two side surfaces of the other end opposite to the movable distal end. The surface electrodes 2 include surface electrodes 2A on the two side surfaces of the other end, and surface electrodes 2B on two side surfaces nearer the middle than the surface electrodes 2A. The longitudinal or the axial direction is hereafter referred to as the Z-direction. The direction orthogonal to the Z-direction and connecting the two side surfaces on which the surface electrodes 2 are located is referred to as the X-direction. The stacking direction orthogonal to the Z- and X-directions and in which the internal electrodes 3 and the piezoelectric layers 4 are stacked is referred to as the Y-direction.

As illustrated in the cross section of FIG. 2A or other figures, the stack 1 includes multiple piezoelectric layers 4 and the internal electrodes 3 between the stacked piezoelectric layers 4. The internal electrodes 3 are exposed on the side surfaces of the other end of the stack 1 and are electrically connected to the surface electrodes 2. The piezoelectric layers 4 include ceramics having piezoelectric properties. Examples of such ceramics include perovskite-type oxides containing lead zirconate titanate ($PbZrO_3$—$PbTiO_3$), lithium niobate ($LiNbO_3$), and lithium tantalate ($LiTaO_3$). The internal electrodes 3 may include, for example, a conductor containing, as a main component, silver or a silver-palladium alloy less reactive with ceramics or a conductor containing copper or platinum. The surface electrodes 2 may include, for example, the same or similar materials as the internal electrode 3, and may further be plated to prevent oxidation.

As described in detail later, the internal electrodes 3 include first electrodes 31 that apply a voltage to the piezoelectric layers 4 to cause the stack 1 to bend in a first direction (X-direction) orthogonal to the longitudinal direction (Z-direction) of the stack 1 and second electrodes 32 that apply a voltage to the piezoelectric layers 4 to cause the stack 1 to bend in a second direction (Y-direction) orthogonal to the longitudinal direction and the first direction. For example, the stack 1 is divided into substantially three areas in the stacking direction (Y-direction). The three areas include a middle area 1M that causes the piezoelectric element 100 to deform by bending in the X-direction (lateral direction). The middle area 1M includes the first electrodes 31. The three areas further include an upper area 1U and a lower area 1L that cause the piezoelectric element 100 to deform by bending in the Y-direction (vertical direction). The upper area 1U and the lower area 1L include the second electrodes 32.

For example, to cause the piezoelectric element 100 to deform by bending in the X-direction, in the middle area 1M, the first electrodes 31 receiving a voltage have an expanded right portion and a contracted left portion. This causes the piezoelectric element 100 to bend to the left. The first electrodes 31 receiving a voltage can have a contracted right portion and an expanded left portion. This causes the piezoelectric element 100 to bend to the right. Similarly, for example, to cause the piezoelectric element 100 to deform by bending in the Y-direction, the second electrodes 32 receiving a voltage can have an expanded upper area 1U and a contracted lower area 1L. This causes the piezoelectric element 100 to bend downward. The second electrodes 32 receiving a voltage can have a contracted upper area 1U and an expanded lower area 1L. This causes the piezoelectric element 100 to bend upward.

Figure 3C:
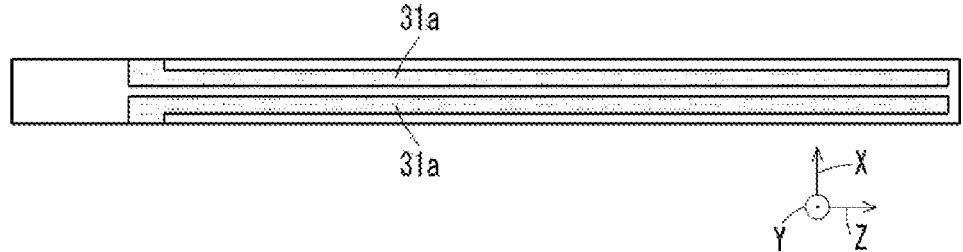
FIG. 3C is a diagram of an internal electrode pattern.
Figure 3D:
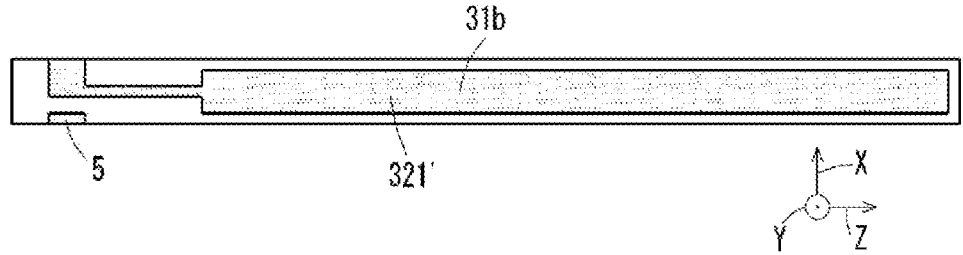
FIG. 3D is a diagram of an internal electrode pattern.
Figure 3E:
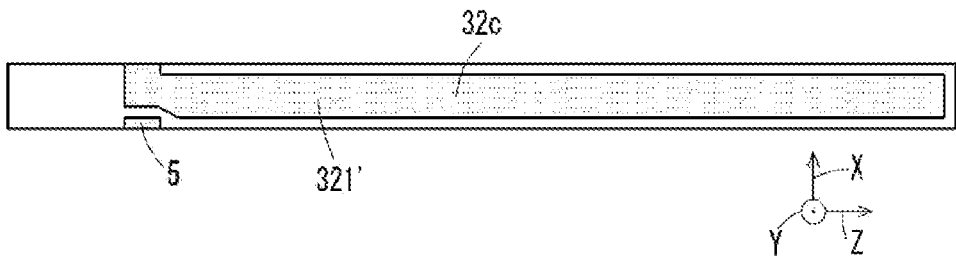
FIG. 3E is a diagram of an internal electrode pattern.
Figure 3F:
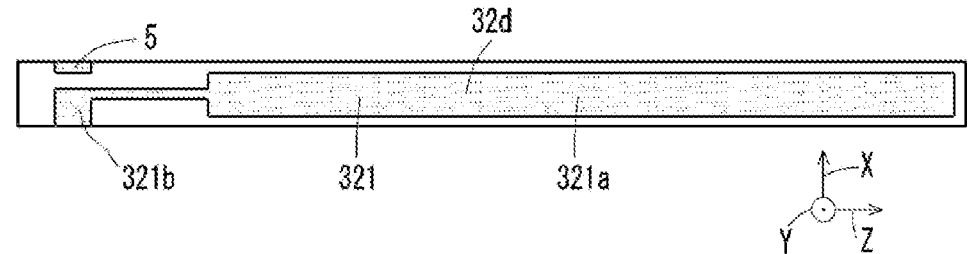
FIG. 3F is a diagram of an internal electrode pattern.

FIGS. 3A to 3F illustrate example patterns on the internal electrodes 3 in the present embodiment. These are example patterns on the second electrodes 32 in the upper area 1U, the first electrodes 31 in the middle area 1M, and the second electrodes 32 in the lower area 1L. The patterns illustrated in FIGS. 3A and 3B are defined on the second electrodes 32 in the upper area 1U. The patterns illustrated in FIGS. 3C and 3D are defined on the first electrodes 31 in the middle area 1M. The patterns illustrated in FIGS. 3E and 3F are defined on the second electrodes 32 in the lower area 1L. As described above, each of the areas includes the internal electrodes 3 having two different patterns. The internal electrodes 3 are alternately located between the piezoelectric layers 4 in the Y-direction. During the operation of the piezoelectric element 100, a voltage is applied externally through the surface electrodes 2 to generate a potential difference between the two different internal electrodes 3. The piezoelectric element 100 can deform by bending in the X- and Y-directions as described above. A voltage applied to the surface electrodes 2 can be changed to control the degree by which and the direction in which the deformation by bending occurs.

The second electrodes 32 in the upper area 1U correspond to second electrodes 32a each illustrated in FIG. 3A and to second electrodes 32b each illustrated in FIG. 3B. The second electrodes 32 in the lower area 1L correspond to second electrodes 32c each illustrated in FIG. 3E and to second electrodes 32d each illustrated in FIG. 3F. Each second electrode 32b illustrated in FIG. 3B includes a first conductor 321 including a strip 321a extending in the longitudinal direction and an extension 321b having one end continuous with the strip 321a and the other end exposed on the side surface of the stack 1 and connected to the surface electrode 2A. The second electrode 32d illustrated in FIG. 3F has the same pattern as the second electrode 32b illustrated in FIG. 3B. The second electrode 32d includes the first conductor 321, similarly to the second electrode 32b. The extension 321b is, for example, substantially L-shaped. The extension 321b has one end continuous with the middle of the strip 321a and extending linearly in the Z-direction, and the other end bending at right angles toward the side surface of the stack 1 to be exposed on the side surface of the stack 1. The extension 321b in substantially an L shape includes a wire 321b1 having a smaller width than the strip 321a and a rectangular portion 321b2 continuous with the wire 321b1. The stack 1 includes, on the side surface on which the extensions 321b are exposed on the other end, the extensions 321b stacked on one another in the Y-direction. In the present embodiment, the piezoelectric element 100 includes second conductors 5 between the extensions 321b and a portion of the side surface of the stack 1 opposite to a portion of the side surface on which the other end of each extension 321b is exposed. The second conductors 5 in the present embodiment are rectangular and have the same length in the Z-direction as the rectangular portion 321b2 of the extension 321b.

The structure that forms the basis of the piezoelectric element according to one or more embodiments of the present disclosure includes no second conductors 5 between the side surfaces of the stack 1 and the extensions 321b, and includes a portion with the extensions 321b thicker than an opposite portion in the X-direction, thus causing the piezoelectric element 100 to have non-uniform thickness and have lower precision in the deformation by bending. In the present embodiment, the second conductor 5 reduces the non-uniform thickness of the stack 1 and thus reduces the likelihood that the piezoelectric element 100 deforms by bending with lower precision.

The piezoelectric element 100 may have any dimensions of, but not limited to, a length of 1 to 3 mm in the X-direction, a length of 1 to 2 mm in the Y-direction, and a length of 20 to 50 mm in the Z-direction. The internal electrodes 3 may each have a thickness of 0.1 to 5 μm. The piezoelectric layers 4 may each have a thickness of 0.01 to 0.1 mm. The second conductors 5 may each have, for example, a width of 1 to 2.5 mm (dimension in the X-direction) and a length of 1 to 3 mm (dimension in the Z-direction).

The first electrodes 31 in the middle area 1M correspond to first electrodes 31a each illustrated in FIG. 3C and to first electrodes 31b each illustrated in FIG. 3D. Each first electrode 31b has a pattern symmetrical to the pattern on the second electrode 32b with respect to the Z-direction. More specifically, in the present embodiment, the first electrode 31b in FIG. 3D includes a first conductor 321'. The first conductor 321' is symmetrical to the first conductor 321 of the second electrode 32b in FIG. 3B with respect to the Z-direction. The middle area 1M includes the second conductors 5, similarly to the upper area 1U. In the present embodiment, the second electrode 32d in FIG. 3F includes the same first conductor 321 as the second electrode 32b in FIG. 3B. The lower area 1L also includes the second conductors 5, similarly to the upper area 1U.

Additionally, the second electrode 32a illustrated in FIG. 3A and the second electrode 32c illustrated in FIG. 3E include a first conductor 321 and a first conductor 321' having a similar shape to the first conductor 321 and the first conductor 321'. The upper area 1U and the lower area 1L further include the second conductors 5.

Although the second conductors 5 are included in all the upper area 1U, the middle area 1M, and the lower area 1L in the present embodiment as described above, the second conductors 5 may not be included in all the areas. One or more second conductors 5 included in the areas can reduce the non-uniform thickness of the stack 1 compared with a piezoelectric element with the structure that forms the basis of the piezoelectric element according to one or more embodiments of the present disclosure with no second conductors 5.

In the present embodiment, the second conductors 5 are exposed on the side surfaces of the stack 1 and connected to the surface electrodes 2A and 2B. This allows more conductors to be exposed on the side surfaces of the stack 1 and increases the wettability of the surface electrodes 2 on the side surfaces of the stack 1 to enhance mechanical strength. As described above, the second conductors 5 effectively reduce the non-uniform thickness of the stack 1. The second conductors 5 may not be electrically connected to the surface electrodes 2. For example, the second conductors 5 may not be exposed on the side surfaces of the stack 1 and may entirely be buried between the piezoelectric layers 4.

This structure can reduce the non-uniform thickness of the stack 1 although the first conductor 321 and the second conductor 5 have different characteristics. Thus, for example, the first conductor 321 and the second conductor 5 may include the same or different materials. When the first conductor 321 and the second conductor 5 include the same material, the two conductors can have a smaller thickness difference between them, thus further reducing the non-uniform thickness of the stack 1.

Figure 4:
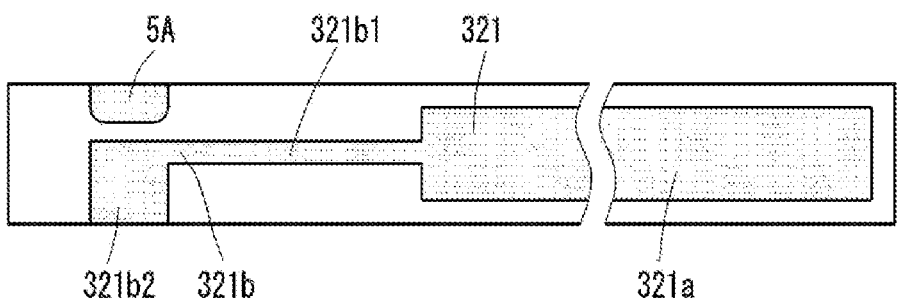
FIG. 4 is a diagram of a second conductor having another shape.
Figure 4:
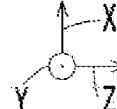

Another embodiment will now be described. The structure according to the present embodiment is the same as in the above embodiment except that the shape of the second conductor, and thus a second conductor having another shape and a first conductor are illustrated in FIG. 4. The other structure will not be illustrated or described. A second conductor 5A in the present embodiment is rectangular and has round corners adjacent to an extension 321b of the first conductor 321. The second conductor 5 having sharp corners instead of the round corners as described in the above embodiment is likely to cause a short circuit due to electric discharge between the second conductor 5 and the extension 321b. To prevent this, a gap is left between the second conductor 5 and the extension 321b of the first conductor 321. The gap reduces an area for the second conductor 5. The second conductor 5A having round corners allows the distance between the second conductor 5A and the extension 321b to be shorter. This enlarges the second conductor 5A and reduces the gap to reduce the non-uniform thickness of the stack 1 further.

The operation of the piezoelectric element 100 will be described briefly. First, the electrical connection between the surface electrodes 2 and the internal electrodes 3 will be described. One surface electrode 2A is electrically connected to the second electrodes 32b in the upper area 1U and the second electrodes 32d in the lower area 1L. The other surface electrode 2A is electrically connected to the first electrodes 31b in the middle area 1M. One surface electrode 2B is electrically connected to the second electrodes 32a in the upper area 1U and the first electrodes 31a (at one side) in the middle area 1M. The other surface electrode 2B is electrically connected to the first electrodes 31a (at the other side) in the middle area 1M and the second electrodes 32c in the lower area 1L. The polarization direction of the piezoelectric layers 4 includes a first direction and a second direction. One side of each of the upper area 1U and middle area 1M is the first direction. The other side of each of the lower area 1L and the middle area 1M opposite to the first direction is the second direction. For example, the surface electrodes 2A are set to a ground potential. A voltage of −64 V is applied to one surface electrode 2B and +64 V to the other surface electrode 2B to polarize the piezoelectric layers 4 as described above.

A constant voltage is applied to each of the surface electrodes 2B during operation. An example voltage to be applied is +11 V to one surface electrode 2B and +61 V to the other surface electrode 2B. A voltage of 0 to +72 V applied to both the surface electrodes 2A can cause the piezoelectric element 100 to deform by bending in an intended direction. For example, a voltage of +72 V is applied to one surface electrode 2A and +36 V to the other surface electrode 2A to cause the piezoelectric element 100 to deform by bending (maximum) in one Y-direction (upward), and a voltage of 0 V is applied to one surface electrode 2A and +36 V to the other surface electrode 2A to cause the piezoelectric element 100 to deform by bending (maximum) in the other Y-direction (downward). In other words, a voltage of 0 to +72 V is applied to one surface electrode 2A, and a constant voltage of +36 V is applied to the other surface electrode 2A to adjust the degree by which the deformation by bending occurs in the Y-direction. For example, a voltage of +36 V is applied to one surface electrode 2A and +72 V to the other surface electrode 2A to cause the piezoelectric element 100 to deform by bending (maximum) in one X-direction (rightward). A voltage of +36 V is applied to one surface electrode 2A and 0 V to the other surface electrode 2A to cause the piezoelectric element 100 to deform by bending (maximum) in the other X-direction (leftward). In other words, a constant voltage of +36 V is applied to one surface electrode 2A, and a voltage of 0 to +72 V is applied to the other surface electrode 2A to adjust the degree by which the deformation by bending occurs in the X-direction. A voltage to be applied to both the surface electrodes 2A is changed within the range of 0 to +72 V to cause the deformation by bending in an oblique direction.

The present disclosure may be implemented in the following forms.

A piezoelectric element according to one or more embodiments of the present disclosure includes a stack including a plurality of internal electrodes and a plurality of piezoelectric layers stacked on one another, and a surface electrode located on a side surface of the stack and connected to the plurality of internal electrodes. The plurality of internal electrodes include a first electrode configured to apply a voltage to the plurality of piezoelectric layers to cause the stack to bend in a first direction orthogonal to a longitudinal direction of the stack, and a second electrode configured to apply a voltage to the plurality of piezoelectric layers to cause the stack to bend in a second direction orthogonal to the longitudinal direction and the first direction. At least one of the first electrode or the second electrode includes a first conductor including a strip extending in the longitudinal direction and an extension having one end continuous with the strip and another end exposed on the side surface of the stack and connected to the surface electrode. The piezoelectric element includes a second conductor located between the extension and an opposite portion of the side surface opposite to a portion of the side surface on which the other end of the extension is exposed.

The piezoelectric element according to the embodiments of the present disclosure includes the second conductors to reduce the non-uniform thickness of the stack, and to reduce the likelihood of the deformation by bending with lower precision.

Although embodiments of the present disclosure have been described in detail, the present disclosure is not limited to the embodiments described above, and may be changed or modified in various manners without departing from the spirit and scope of the present disclosure. The components described in the above embodiments may be entirely or partially combined as appropriate unless any contradiction arises.

REFERENCE SIGNS 1 stack
1L lower area
1M middle area
1U upper area
2, 2A, 2B surface electrode
3 internal electrode
4 piezoelectric layer
5, 5A second conductor
31, 31a, 31b first electrode
32, 32a, 32b, 32c, 32d second electrode
100 piezoelectric element
321, 321' first conductor
321a strip
321b extension
321b1 wire
321b2 rectangular portion

The invention claimed is:

1. A piezoelectric element, comprising:
a stack including a plurality of internal electrodes and a plurality of piezoelectric layers; and
a surface electrode located on a side surface of the stack and electrically connected to the plurality of internal electrodes, wherein the plurality of internal electrodes includes
a first electrode configured to bend the stack in a first direction perpendicular to a longitudinal direction of the stack by applying a voltage to the plurality of piezoelectric layers, and
a second electrode configured to bend the stack in a second direction perpendicular to the longitudinal direction and the first direction by applying a voltage to the plurality of piezoelectric layers,
at least one of the first electrode or the second electrode comprising:
a first conductor comprising:
a strip extending in the longitudinal direction; and
an extension one end of which is connected to the strip, and another end of which is exposed at the side surface of the stack and connected to the surface electrode; and
a second conductor between the extension and a portion opposite to an other portion where the another end of the extension is exposed,
wherein the second conductor has a rectangular shape, and includes a round corner adjacent to the extension.

2. The piezoelectric element according to claim 1, wherein the first conductor and the second conductor is composed of a same material.

3. The piezoelectric element according to claim 1, the second conductor is exposed to the portion opposite to the other portion of the side surface.

4. The piezoelectric element according to claim 1, wherein
each of the first electrode and the second electrode each includes the first conductor, and
in a plan view, a portion of the side surface on which the extension of the first conductor included in the first electrode is exposed is located opposite to a portion of the side surface on which the extension of the first conductor included in the second electrode is exposed.

5. The piezoelectric element according to claim 1, wherein the extension includes
a wire including the one end and having smaller width than the strip, and a rectangular portion including the other end and that is continuous with the wire.

* * * * *